(12) United States Patent
Teterwak

(10) Patent No.: US 12,316,729 B2
(45) Date of Patent: *May 27, 2025

(54) TRANSMITTING CLOCK REFERENCE OVER REVERSE CHANNEL IN A BIDIRECTIONAL SERIAL LINK

(71) Applicant: Maxim Integrated Products, Inc., San Jose, CA (US)

(72) Inventor: Jerzy A. Teterwak, Colorado Springs, CO (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/647,834

(22) Filed: Apr. 26, 2024

(65) Prior Publication Data

US 2024/0348420 A1 Oct. 17, 2024

Related U.S. Application Data

(63) Continuation of application No. 17/890,817, filed on Aug. 18, 2022, now Pat. No. 12,003,612.

(Continued)

(51) Int. Cl.
*H04L 7/033* (2006.01)
*H03L 7/08* (2006.01)
(Continued)

(52) U.S. Cl.
CPC ............ *H04L 7/033* (2013.01); *H03L 7/0807* (2013.01); *H03L 7/087* (2013.01); *H04L 7/0004* (2013.01)

(58) Field of Classification Search
CPC ..... H04L 7/033; H04L 7/0004; H04L 7/0008; H03L 7/0807; H03L 7/087; H03L 7/07; H03L 7/0812
See application file for complete search history.

(56) References Cited

U.S. PATENT DOCUMENTS 5,506,874 A * 4/1996 Izzard ..................... H03L 7/085
375/376
7,239,188 B1 7/2007 Xu et al.
(Continued)

OTHER PUBLICATIONS

"RC32614A Datasheet: Ultra-Low Phase Noise System Synchronizer", Nov. 11, 2021 (initial release)—Apr. 12, J022 (last revision), Renesas Electronics COrporation, Tokyo, Japan, hllps://www.renesas.com/us/en/documenl/dsl/ c32614-datasheet.

(Continued)

*Primary Examiner* — Vineeta S Panwalkar
(74) *Attorney, Agent, or Firm* — Knobbe, Martens, Olson & Bear, LLP

(57) ABSTRACT

A clock recovery circuit includes a clock detector configured to receive a serial data stream from a remote device over a reverse channel, wherein the serial data stream includes clock reference data, reverse channel data, or a combination of the clock reference data and the reverse channel data, and the clock detector configured to output a clock detect signal in response to detecting the clock reference data in the serial data stream; a phase lock loop including a first detector configured to receive the serial data stream and to detect phase and frequency; and a controller configured to receive the clock detect signal and to selectively enable the first detector based on the clock detect signal.

31 Claims, 4 Drawing Sheets

Related U.S. Application Data

(60) Provisional application No. 63/242,887, filed on Sep. 10, 2021.

(51) Int. Cl.
*H03L 7/087* (2006.01)
*H04L 7/00* (2006.01)

(56) References Cited

U.S. PATENT DOCUMENTS

| | | |
|---|---|---|
| 9,413,525 B2 | 8/2016 | Takeuchi |
| 10,116,468 B1 | 10/2018 | Hormati |
| 10,153,917 B1 | 12/2018 | Tonietto et al. |
| 10,868,663 B1 * | 12/2020 | Turker Melek ....... H04L 7/0004 |
| 12,003,612 B2 | 6/2024 | Teterwak |
| 2009/0028281 A1 | 1/2009 | Chulwoo et al. |

OTHER PUBLICATIONS

"7 Series FPGAs GTX/GTH Transceivers", Mar. 1, 2011 (initial release)—Aug. 14, 2018 (last revision), Xilinx, Inc., hllps://docs.xilinx.com/v/u/en-US/ug476_7Series_Transceivers.
"Clock Data Recovery", Oct. 22, 2020, Skylane Optics, https://www.skylaneoptics.com/en/articles/clock-data- ecovery-cdr/.
LalliceSC MACO Core LSCDR1X18 Low-Speed Clock and Data Recovery User's Guide, Jan. 2007 (initial elease)—Jan. 2008 (last revision), Lattice Semiconductor Corporation.

* cited by examiner

TRANSMITTING CLOCK REFERENCE OVER REVERSE CHANNEL IN A BIDIRECTIONAL SERIAL LINK

TECHNICAL FIELD

The present disclosure relates to bi-directional serial data links, and more particularly to bi-directional serial data links that transmit a clock reference over a link to a remote device.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Some bidirectional serial data links between two devices may transmit significantly more data in one direction than in the other direction. Generally, the higher bandwidth direction is called the forward direction and the lower bandwidth direction is called the reverse direction. Serializer/deserializer (SERDES) circuits on both sides of the bidirectional serial data link require an accurate timing reference (or clock) to prevent errors during operation. To provide accurate clocks, crystal oscillators on both sides of the bidirectional serial data link are typically used. A frequency output of the crystal oscillator has high accuracy to maintain a frequency error between transmitters and receivers of the SERDES below a predetermined limit.

The need for crystal oscillators at both ends of the link significantly increases the component count and the overall cost of the communication system. For example, in some surround view camera systems for vehicles, four remote cameras are typically used and five crystal oscillators are required by the system. Furthermore, the crystal oscillators at the remote devices may be subjected to extreme temperature variations, which may reduce reliability.

BRIEF DESCRIPTION OF THE DRAWINGS

Areas of applicability of the present disclosure will become apparent from the detailed description, the claims and the drawings. The detailed description and specific examples are intended for purposes of illustration only and are not intended to limit the scope of the disclosure. The present disclosure will become more fully understood from the detailed description and the accompanying drawings, wherein:

In the drawings, reference numbers may be reused to identify similar and/or identical elements.

DETAILED DESCRIPTION

A bidirectional serial data link is established between a device (at the far side of the link) and one or more remote devices (at the near side of the link) over a medium. The far side device includes a crystal oscillator that is used to establish a reference clock. The one or more remote devices include a clock recovery circuit that establishes a reference clock without using a crystal oscillator located at the one or more remote devices.

The devices on both sides of the link power up and perform an initial low frequency handshake. The charge pump of the remote device is disabled and the VCO generates the clock in an open loop during that time. The SERDES of the far-side device starts sending clock reference data and the clock reference data is detected by the remote device.

After the clock reference data is detected by the remote device, the controller of the remote device enables the charge pump and a phase frequency detector (PFD). The PLL loop is closed and the PLL locks to the reference clock frequency using the PFD. After the PLL is locked using the clock reference data, the controller switches the PLL detector from PFD to PD. A message is sent by the remote device to the far side of the link to start sending data. The far side of the link starts sending data and the link operates in data transmit mode.

Figure 1:
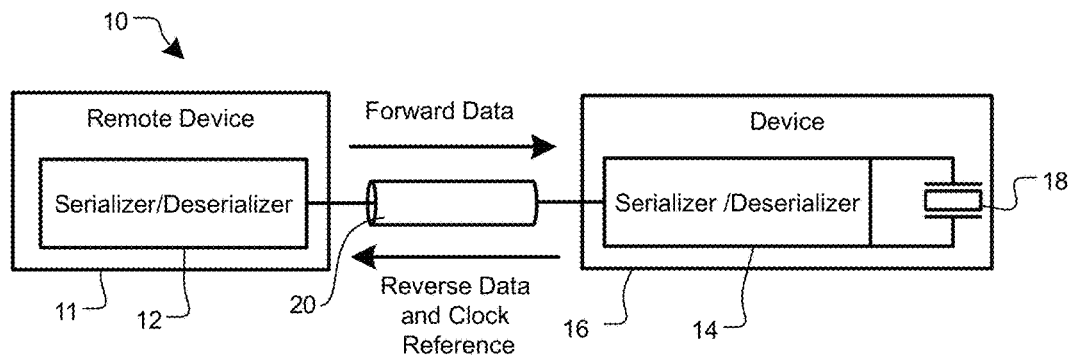
FIG. 1 is a functional block diagram of an example of a serial data link including a remote device that sends serialized data to and receives serialized data from another device according to the present disclosure.

Referring now to FIG. 1, a communication system 10 includes a remote device 11 including a serializer/deserializer (SERDES) 12 that sends serialized data to and receives serialized data from a SERDES 14 of a device 16. In some examples, the remote device 11 includes a camera and the device 16 includes a video processing device, although other types of devices can be used.

Forward data refers to data sent from the remote device 11 to the device 16 (since this channel direction corresponds to a higher bandwidth direction). Reverse data refers to data and control signals sent from the device 16 to the remote device 11 (since this channel direction corresponds to a lower bandwidth direction). In some examples, the forward data includes video data that is sent by one or more remote cameras to the video processing device and reverse data and timing references are sent by the video processing device to the one or more remote cameras.

The SERDES 12 and 14 require a timing reference (or clock signal) for proper operation. The SERDES 14 of the device 16 includes a crystal oscillator 18 that is used to generate reference clock. The device 16 embeds clock reference data in serialized data that is transmitted over the reverse channel to the SERDES 12 associated with the remote device 11 during startup. The SERDES 12 of the remote device 11 does not require a crystal oscillator. The SERDES 12 uses the clock reference data to lock a PLL of a phase frequency detector. Once locked, the SERDES 12 reconfigures to use phase detection (PD), and sends a synchronization message to the device to start transmitting data. Thereafter, the SERDES 12 generates the clock reference for the remote device 11 based on the closed loop VCO clock and data transitions in the serialized data.

Figure 2:
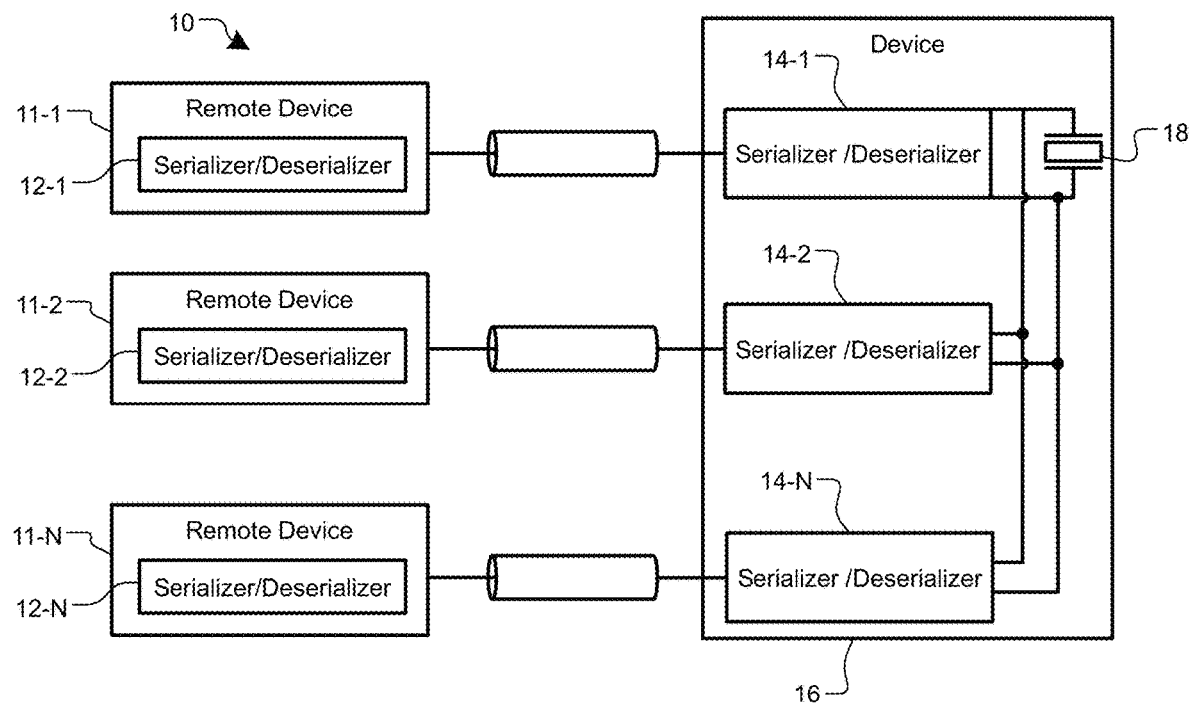
FIG. 2 is a functional block diagram of an example of a serial data link including a plurality of remote devices that send serialized data to and receive serialized data from another device according to the present disclosure.

In FIG. 2, a plurality of remote devices 11-1, 11-2, ..., and 11-N (such as remote cameras in a vehicle) may be connected by SERDES 12-1, 12-2, ..., and 12-N to the SERDES 14-1, 14-2, 14-N, respectively, of the device 16 (such as a video processing device) where N is an integer greater than one. In this example, the SERDES 14-1, 14-2, 14-N share the crystal oscillator 18 and none of the SERDES 12-1, 12-2, . . . , and 12-N require crystal oscillators as will be described further below.

Figure 3:
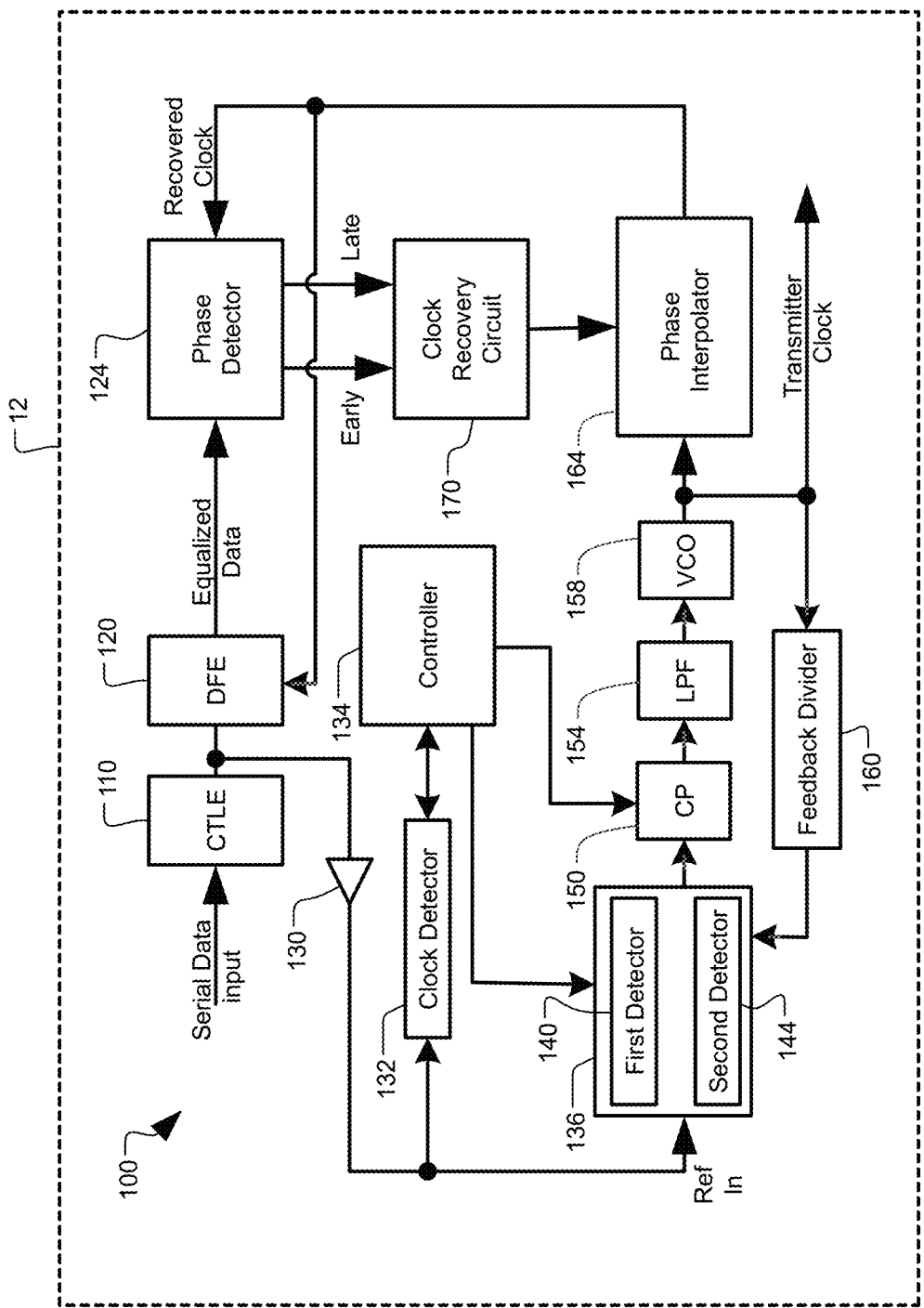
FIG. 3 is a functional block diagram of an example of a clock recovery circuit for a SERDES of a remote device according to the present disclosure.

Referring now to FIG. 3, a clock recovery circuit 100 of the SERDES 12 that is associated with the remote device 11 is shown. The clock recovery circuit 100 includes a continuous time linear equalizer (CTLE) 110 that receives a signal from a medium. An output of the CTLE 110 is input to a decision feedback equalizer (DFE) 120 and an amplifier 130. The output of the DFE 120 may be output to other portions of receiver (not shown) of the remote device 11.

An output of the amplifier 130 is fed to a clock detector 132 and to an input of a detector 136 including a first detector 140 and a second detector 144. In some examples, the first detector 140 includes a phase/frequency detector (PFD) and the second detector 144 includes a Hogge phase detector (PD), although other types of detectors can be used.

The clock detector 132 detects the presence of the clock reference data in the serialized data and generates an enable signal when the clock reference data is detected. The enable output of the clock detector 132 is output to a controller 134.

An output of the detector 136 is also input to a charge pump 150. The charge pump 150 is selectively disabled or enabled by the controller 134 to operate a voltage controlled oscillator (VCO) 158 in an open loop mode or a closed loop mode, respectively. More particularly, the controller 134 disables the charge pump 150 until the clock reference data is detected on the link and then the controller 134 enables the charge pump 150 to allow the PLL loop to close using the phase/frequency detector and to lock to the reference clock frequency. An output of the charge pump 150 is input to a low pass filter (LPF) 154 to filter signals input thereto. An output of the LPF 154 is input to the VCO 158.

In other words, the VCO 158 can be configured by the controller 134 to operate in either an open loop mode or a closed loop mode. The controller 134 initially operates the VCO 158 in open loop mode until the clock reference data is detected on the link and then transitions the VCO 158 to closed loop mode by enabling the charge pump 150.

An output of the VCO 158 is input to a feedback divider 160 and to a phase interpolator 164. In some examples, the feedback divider reduces the frequency of the output by A/B, where A and B are integers and A<B. The output of the VCO 158 may also be fed to a transmitter circuit (not shown). An output of the feedback divider 160 is input to the detector 136. In some examples, the phase interpolator 164 includes input and output frequency dividers.

Equalized data output by the DFE 120 is input to a phase detector 124. The phase detector 124 also receives a recovered clock from an output of the phase interpolator 164 during some modes of operation. The recovered clock is also output to the DFE 120. In some examples, the phase detector 124 includes a bang-bang phase detector that generates early and late decisions. The phase detector 124 outputs early and late decisions to a clock recovery circuit 170. An output of the clock recovery circuit 170 is input to the phase interpolator 164.

Figure 4:
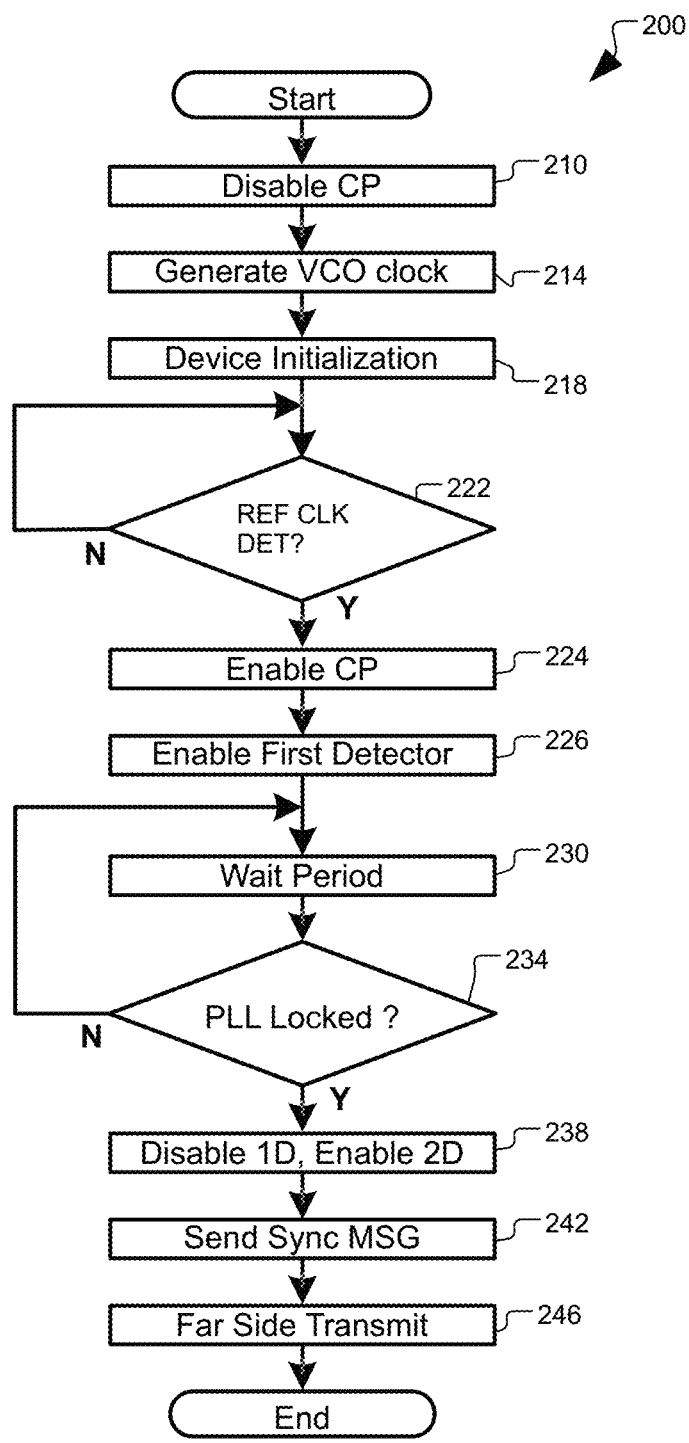
FIG. 4 is a flowchart of an example of a method for establishing a clock reference at a remote device according to the present disclosure.

Referring now to FIG. 4, a method 200 for establishing a reference clock at a remote SERDES without using crystal oscillators at the remote device is shown. At 210, the controller 134 disables the charge pump 150. At 214, the controller 134 causes the VCO 158 to generate a reference clock. Since the charge pump 150 is disabled, the VCO 158 operates in an open loop mode. At 218, the controller 134 performs device initialization. For example, device initialization may involve a handshake operation to establish communication over the link.

At 222, the method determines whether the clock detector 132 has detected the reference clock in the serial data over the reverse channel. When 222 is true, the clock detector 132 sends an enable signal to the controller 134. The method continues at 224 and the controller 134 enables the charge pump 150 at 224. After enabling the charge pump 150, the VCO 158 receives a reference clock and begins operating in closed loop mode. At 226, the controller 134 enables the first detector 140. In some examples, the first detector 140 performs phase/frequency detection (PFD).

After a predetermined period at 230, the controller 134 determines whether the phase lock loop (PLL) of the first detector 140 has locked at 234. If the PLL has not locked as determined at 234, the method returns to 230. If the PLL has locked as determined at 234, the method continues at 238 and disables the first detector 140 and enables the second detector 144. In some examples, the second detector 144 performs phase detection (PD). In some examples, the second detector 144 is a Hogge phase detector.

At 242, the method sends a message over the reverse channel to the far side of the link and to the SERDES 14 of the device 16 to indicate synchronization of the remote device 11. At 246, the SERDES 14 of the remote device 11 starts transmitting data, from the far side of the link, in response to the synchronization message. Thereafter, the SERDES 14 of the remote device 11 adjusts the reference clock based on the closed loop VCO clock and data transitions in the serialized data.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules and circuit elements are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "controller" may be replaced with the term "circuit." The term "controller" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip. The functionality of any given controller of the present disclosure may be distributed among multiple controllers that are connected via interface circuits.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc). The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

A clock recovery circuit for a serializer/deserializer in one embodiment includes a clock detector configured to receive a serial data stream from a remote device over a reverse channel. The serial data stream selectively includes one of clock reference data and reverse channel data and, in response to detecting the clock reference data in the serial data stream, to output a clock detect signal. A phase lock loop includes a first detector configured to receive the serial data stream and to detect phase and frequency, a second detector configured to receive the serial data stream and to detect phase, a voltage controlled oscillator configured to selectively communicate with an output of the first detector and to output a clock signal, and a frequency divider configured to divide the clock signal and to output a divided clock signal to the first detector. A controller is configured to receive the clock detect signal and to selectively enable the first detector based on the clock detect signal.

In other features, the second detector comprises a Hogge phase detector. A charge pump is configured to receive an output of the first detector. A low pass filter is configured to receive an output of the charge pump. The voltage controlled oscillator is configured to operate in one of an open loop mode and a closed loop mode. Upon startup, the controller is configured to disable the charge pump and configure the voltage controlled oscillator in the open loop mode.

In yet other features, the controller is configured to perform device initialization. After initialization, the controller enables the clock detector. When the clock detector generates the clock detect signal, the controller enables the charge pump and the first detector. When the first detector is locked, the controller is configured to disable the first detector and enable the second detector. The controller is configured to start transmitting data after enabling the second detector. The clock reference data comprises a predetermined pattern of alternating ones and zeros.

A clock recovery circuit for a serializer/deserializer includes a clock detector configured to receive a serial data stream from a remote device over a reverse channel. The serial data stream selectively includes one of clock reference data and reverse channel data and, in response to detecting the clock reference data in the serial data stream, to output a clock detect signal. A phase lock loop includes a detector configured to receive the serial data stream and to operate as one of a phase/frequency detector and a phase detector, a voltage controlled oscillator configured to selectively communicate with an output of the detector and to output a clock signal, and a frequency divider configured to divide the clock signal and to output a divided clock signal to the detector. A controller is configured to receive the clock detect signal and to selectively enable the detector based on the clock detect signal.

Figure 5:
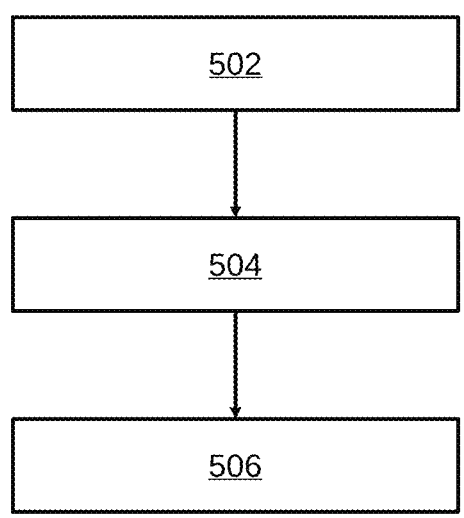
FIG. 5 is a method of manufacturing a clock recovery circuit for a serializer/deserializer.

Referring now to FIG. 5, therein is shown a method of manufacturing a clock recovery circuit for a serializer/deserializer comprising: configuring a clock detector to receive a serial data stream from a remote device over a reverse channel, wherein the serial data stream includes clock reference data, reverse channel data, or a combination of the clock reference data and the reverse channel data, and configuring the clock detector includes configuring the clock detector to output a clock detect signal in response to detecting the clock reference data in the serial data stream in a block 502; configuring a phase lock loop including a first detector to receive the serial data stream and to detect phase and frequency in a block 504; and configuring a controller to receive the clock detect signal and to selectively enable the first detector based on the clock detect signal in a block 506.

What is claimed is:

1. A clock recovery circuit for a serializer/deserializer comprising:
a clock detector configured to receive a serial data stream from a remote device over a reverse channel, wherein the serial data stream includes clock reference data, and the clock detector configured to output a clock detect signal in response to detecting the clock reference data in the serial data stream;
a phase lock loop including a first detector configured to receive the serial data stream and to detect phase and frequency; and
a controller configured to receive the clock detect signal and to selectively enable the first detector based on the clock detect signal.

2. The clock recovery circuit of claim 1, wherein the controller is configured to perform device initialization.

3. The clock recovery circuit of claim 1, wherein the controller is configured to enable the clock detector after initialization.

4. The clock recovery circuit of claim 1, wherein the clock reference data comprises a predetermined pattern of ones and zeros.

5. The clock recovery circuit of claim 1, wherein the phase lock loop further comprises a second detector configured to receive the serial data stream and to detect a second phase.

6. The clock recovery circuit of claim 5, wherein the second detector comprises a Hogge phase detector.

7. The clock recovery circuit of claim 5, wherein the controller is configured to disable the first detector and enable the second detector based on the first detector being locked.

8. The clock recovery circuit of claim 5, wherein the controller is configured to start transmitting data after enabling the second detector.

9. The clock recovery circuit of claim 1, further comprising a charge pump configured to receive an output of the first detector.

10. The clock recovery circuit of claim 9, further comprising a low pass filter configured to receive an output of the charge pump.

11. The clock recovery circuit of claim 9, wherein the controller is configured to enable the charge pump and the first detector based on the clock detector generating the clock detect signal.

12. The clock recovery circuit of claim 1, wherein the phase lock loop further comprises a voltage controlled oscillator configured to selectively communicate with an output of the first detector and to output a clock signal.

13. The clock recovery circuit of claim 12, wherein the phase lock loop further comprises a frequency divider configured to divide the clock signal and to output a divided clock signal to the first detector.

14. The clock recovery circuit of claim 12, wherein the voltage controlled oscillator is configured to operate in either an open loop mode or a closed loop mode.

15. The clock recovery circuit of claim 12, wherein upon startup, the controller is configured to disable a charge pump coupled to the first detector, and to configure the voltage controlled oscillator in an open loop mode.

16. A clock recovery circuit for a serializer/deserializer comprising:
a clock detector configured to receive a serial data stream from a remote device over a reverse channel, wherein the serial data stream includes clock reference data, and the clock detector configured to output a clock detect signal in response to detecting the clock reference data in the serial data stream;
a phase lock loop including a detector configured to receive the serial data stream and to operate as a phase/frequency detector, or a phase detector, the phase lock loop further comprises a voltage controlled oscillator configured to selectively communicate with an output of the detector and to output a clock signal; and
a controller configured to receive the clock detect signal and to selectively enable the detector based on the clock detect signal.

17. A method of manufacturing a clock recovery circuit for a serializer/deserializer comprising:
configuring a clock detector to receive a serial data stream from a remote device over a reverse channel, wherein the serial data stream includes clock reference data, and configuring the clock detector includes configuring the clock detector to output a clock detect signal in response to detecting the clock reference data in the serial data stream;
configuring a phase lock loop including a first detector to receive the serial data stream and to detect phase and frequency; and
configuring a controller to receive the clock detect signal and to selectively enable the first detector based on the clock detect signal.

18. The method of claim 17, wherein configuring the controller includes configuring the controller to perform device initialization.

19. The method of claim 17, wherein configuring the controller includes configuring the controller to enable the clock detector after initialization.

20. The method of claim 17, wherein configuring the clock detector includes configuring the clock detector to receive the serial data stream including the clock reference data comprising a predetermined pattern of ones and zeros.

21. The method of claim 17, wherein configuring the phase lock loop further comprises configuring a second detector to receive the serial data stream and to detect a second phase.

22. The method of claim 21, wherein configuring the second detector comprises configuring a Hogge phase detector.

23. The method of claim 21, wherein configuring the controller includes configuring the controller to disable the first detector and enable the second detector based on the first detector being locked.

24. The method of claim 21, wherein configuring the controller includes configuring the controller to start transmitting data after enabling the second detector.

25. The method of claim 17, further comprising configuring a charge pump to receive an output of the first detector.

26. The method of claim 25, further comprising configuring a low pass filter to receive an output of the charge pump.

27. The method of claim 25, wherein configuring the controller includes configuring the controller to enable the charge pump and the first detector based on the clock detector generating the clock detect signal.

28. The method of claim 17, wherein configuring the phase lock loop further comprises configuring a voltage controlled oscillator to selectively communicate with an output of the first detector and to output a clock signal.

29. The method of claim 28, wherein configuring the phase lock loop further comprises configuring a frequency divider to divide the clock signal and to output a divided clock signal to the first detector.

30. The method of claim 28, wherein configuring the voltage controlled oscillator includes configuring the voltage controlled oscillator to operate in either an open loop mode or a closed loop mode.

31. The method of claim 28, wherein configuring the controller includes configuring the controller, upon startup, to disable a charge pump coupled to the first detector, and to place the voltage controlled oscillator in an open loop mode.

* * * * *